United States Patent [19]

Rumelhard

[11] Patent Number: 4,686,387

[45] Date of Patent: Aug. 11, 1987

[54] BIASING CIRCUIT FOR A FIELD EFFECT TRANSISTOR

[75] Inventor: Christian Rumelhard, Creteil, France

[73] Assignee: Thomson-CSF, Paris, France

[21] Appl. No.: 692,127

[22] Filed: Jan. 17, 1985

[30] Foreign Application Priority Data

Jan. 20, 1984 [FR] France ............................... 84 00889

[51] Int. Cl.⁴ ............... H03K 17/284; H03K 17/687; H03G 11/04; H04B 3/04
[52] U.S. Cl. .............................. 307/296 R; 307/571; 307/304; 307/264; 323/315; 330/277; 330/296
[58] Field of Search ............ 307/571, 584, 585, 575, 307/577, 450, 270, 297, 296 R, 304, 264; 330/277, 296, 297, 288, 257; 323/312, 315, 317; 328/169-172; 333/17 L

[56] References Cited

U.S. PATENT DOCUMENTS

| | | | |
|---|---|---|---|
| 3,780,321 | 12/1973 | Lentz | 307/304 |
| 3,835,410 | 9/1974 | Wittlinger | 323/315 X |
| 3,925,718 | 12/1975 | Wittlinger | 323/315 |
| 4,157,557 | 6/1979 | Sato et al. | 328/171 X |
| 4,162,412 | 7/1979 | Mawhinney et al. | 307/264 X |
| 4,167,681 | 9/1979 | Wolkstein et al. | 307/264 X |
| 4,179,668 | 12/1979 | Schuermann | 330/277 |
| 4,245,165 | 1/1981 | Hoffmann | 307/584 X |
| 4,316,243 | 2/1982 | Archer | 307/584 X |
| 4,338,572 | 7/1982 | Schürmann | 330/277 |
| 4,459,498 | 7/1984 | Stengl et al. | 307/584 |
| 4,550,274 | 10/1985 | Weber | 307/571 X |

FOREIGN PATENT DOCUMENTS

| | | | |
|---|---|---|---|
| 0048885 | 4/1982 | European Pat. Off. | 307/571 |
| 2010329 | 9/1970 | Fed. Rep. of Germany | 307/571 |
| 2740800 | 3/1979 | Fed. Rep. of Germany | 307/584 |
| 80/01527 | 7/1980 | PCT Int'l Appl. | 307/571 |
| 2057803 | 4/1981 | United Kingdom | 307/571 |

OTHER PUBLICATIONS

Shlyehkov, "Operating Point Stabilization in a Series Fed Amplifier Stage Comprising Field Effect and Bipolar Transistors", Telecommunication and Radio Engineering, vol. 29, No. 8, Aug. 1975.

Primary Examiner—John S. Heyman
Assistant Examiner—David R. Bertelson
Attorney, Agent, or Firm—Oblon, Fisher, Spivak, McClelland & Maier

[57] ABSTRACT

A circuit for biasing a field effect transistor using two voltages. With said circuit, the bias point of the transistor may be varied by varying the source bias voltage. At least one access electrode is polarized from a bias voltage through a first secondary transistor operating as saturable load. The gate of the main transistor and the gate of the saturable load are connected at two points of a divider bridge, supplied by the two bias voltages and comprising at least two resistors and a second secondary transistor. The gate-source voltage of said saturable load follows the gate-source voltage of said main transistor.

7 Claims, 9 Drawing Figures

BIASING CIRCUIT FOR A FIELD EFFECT TRANSISTOR

BACKGROUND OF THE INVENTION

1. Field of the Invention

The present invention relates to a biasing circuit for a field effect transistor operating at ultra high frequencies. With this biasing circuit, the biasing voltages on two electrodes on the transistor, one of which is the gate, can be varied simultaneously. It is particularly interesting in the case where it is itself integrated on a monolithic integrated circuit comprising other functions, for it occupies a much smaller area on the semi conductor material chip than known circuits.

2. Description of the Prior Art

So as not to disturb the microwave—or ultra high frequency—signals, the biasing circuits must be filtered by means which let the DC biasing currents or voltages pass but isolate the microwave power. These means are most often chokes, microband lines or very high value resistances. The drawback with the first two is that they do not have the dimensions and technology compatible with integrated circuits. Resistances have the drawback that, if a drain current is required, the voltage drop through the resistance is high, and the biasing voltage must be high.

In other known circuits, the drain bias of the main field effect transistor is provided by a secondary field effect transistor, current source connected with the gate connected to the source: but the bias voltage of the drain is fixed in this case and it is not possible to vary the gate bias voltage, so the biasing point of the main transistor.

SUMMARY OF THE INVENTION

In the biasing circuit of the invention, biasing of the drain (or of the source depending on the circuit used) of the main field effect transistor is provided by at least a first secondary transistor, operating as saturable load, whose gate-source voltage follows the gate-source voltage of the main field effect transistor because of a resistance bridge fed by a second secondary field effect transistor, mounted as current source.

More precisely, the invention provides a biasing circuit for a field effect transistor, operating in the ultra high frequency range whose gate is biased by a voltage through a first resistance, in which circuit at least one access electrode of the main transistor, through which the ultra high frequency signal leaves, is biased from a voltage source through a first secondary field effect transistor operating as saturable load, whose gate-source voltage follows the gate-source voltage of the main transistor, the gates of these two transistors being joined together at two points (B and A respectively) of a divider bridge formed by at least two resistances, fed from the two bias voltages through a second secondary transistor mounted as current source.

BRIEF DESCRIPTION OF THE DRAWINGS

The invention will be better understood from the following detailed description of some biasing examples, the main transistor being common source or common drain or common gate connected. These descriptions refer to the following Figures which show.

DESCRIPTION OF THE PREFERRED EMBODIMENTS

Figure 1:
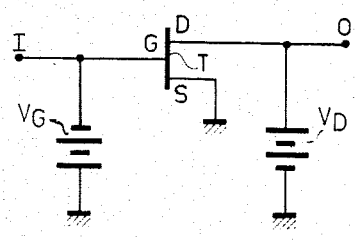
FIG. 1: a basic diagram for biasing a field effect transistor.

In order to operate correctly, a field effect transistor operating in the ultra high frequency or microwave range, must be biased by a DC voltage on the drain and a DC voltage on the gate, as shown in FIG. 1 which is the basic diagram for biasing a common source connected field effect transistor.

Let T be this field effect transistor, whose source is connected to ground; the ultra high frequency signals are fed to the gate of the transistor at the input point I and they leave the device at the drain at a point referenced O. In order to operate correctly, it is then necessary for a voltage VD to be applied to the drain and a voltage VG to be applied to the gate, these two voltages being shown in FIG. 1 by the symbolic diagram of a voltage generator.

But, in these circuits, the gate voltage VG must be able to be varied so as to be able to choose the operating point of the transistor, for example so that an amplifier may operate in class A, or in class B or in class C. Or else to be able to choose an operating point corresponding to minimum noise, in the case of amplifiers. Or else so as to be able to vary a phase in the case of phase shifters.

So that the biasing circuits do not disturb the operation of the microwave circuit, the bias voltages are applied to the gate and the drain through filtering circuits which let the DC voltages pass but which isolate the microwave power. Three examples of such circuits are shown in FIGS. 2, 3 and 4.

Figure 2:
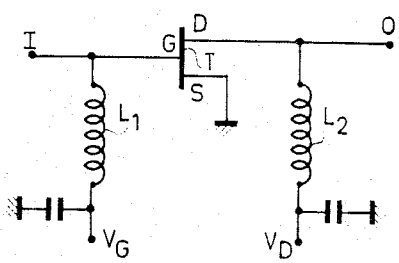
FIGS. 2 to 5: practical diagrams for biasing a field effect transistor of the prior art.

In FIG. 2, the gate $V_G$ and drain $V_D$ voltages are applied respectively to the gate and the drain of transistor T through surge inductances $L_1$ and $L_2$. The voltages $V_G$ and $V_D$ are further filtered by a small capacitor connected in parallel and grounded. This biasing method is perfectly valid in the case of hybrid circuits for example or discretely connected field effect transistors, for the gate voltage $V_G$ and the drain voltage $V_D$ may be varied independently. But for a monolithic integrated circuit, which comprises a high number of transistors such as transistor T, the surge inductances which in practice are formed by gold deposits providing the junction between the metal stud of the gate or drain, are not technologically compatible with the construction of the integrated circuits because of their prohibitive dimensions.

Figure 3:
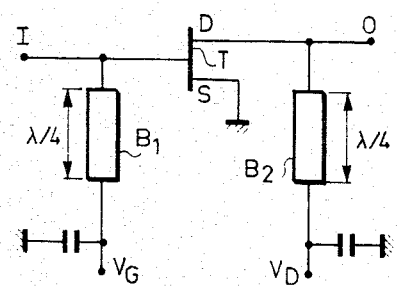
Figure 4:
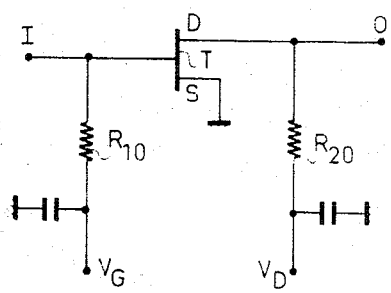

In FIG. 3, transistor T is biased on its gate and on its drain by two microstrip lines referenced $B_1$ on the gate and $B_2$ on the drain. It is over these two microstrip lines $B_1$ and $B_2$ that the gate bias $V_G$ and drain bias $V_D$ voltages are applied respectively: the microstrip lines have a high characteristic impedance and a length equal to a quarter of a wave $\lambda/4$ at the operating frequency of the transistor. This biasing method is well known, it is reliable, but, like biasing through surge inductances, its technology is not compatible with the technology for manufacturing integrated circuits.

Whereas the dimensions of a field effect transistor operating in the ultra high frequency wave is reckoned in microns, the dimensions of a λ/4 microstrip in the same frequencies, between 10 and 15 GHz for example, are rather reckoned in millimeters so there is a dimensional ratio between transistors and microstrip lines which is of the order of $10^3$. In FIG. 4, the bias voltages are applied through resistances having sufficiently high values so as not to disturb the operation of the microwave circuits. That is to say that these resistances let a DC bias current pass but present an infinite value to the passage of an ultra high frequency signal. The use of bias resistances is more compatible technologically than the use of inductances or microstrip lines, for resistances can be provided having high values and only occupying a very small area on the chip of an integrated circuit. However, such a circuit using resistances is only suitable for the gate as long as it is not biased positively, for the DC gate current is very small and no voltage drop appears in resistor $R_{10}$ connected to the gate. On the other hand, in so far as the drain is concerned, resistor $R_{20}$ must be sufficiently large so as not to disturb the ultra high frequency circuit but, simultaneously, must let a drain current pass, for example 250 milliamps per millimeter of gate width, which results in extremely high voltage drops, and consequently in extremely high bias voltages $V_D$ applied across resistor $R_{20}$, and outside the voltage range usually used in integrated circuits.

Figure 5:
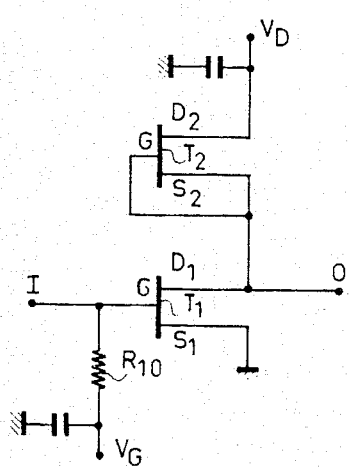

To get over this drawback, the circuit shown in FIG. 5 is sometimes used. In this circuit for biasing a transistor $T_1$, the gate bias is provided by a voltage $V_G$ decoupled to ground through a resistor $R_{10}$, as in FIG. 4. On the other hand, the drain of transistor $T_1$, which will be called hereafter the main transistor, that is to say the one which it is desired to bias, is biased by a voltage $V_D$ through a secondary current source mounted transistor $T_2$, that is to say whose gate is connected to the source, which allows a high DC current to pass while presenting, in the ultra high frequency range, a high dynamic impedance due to the saturation of the current. This is why the secondary transistor T is called saturable load for it is well known that, when the drain current curves are plotted as a function of the drain voltage of the field effect transistor, these curves rapidly show saturation.

This bias circuit introduces some additional losses, which means that in some cases two saturable loaded transistors such as $T_2$ are connected in series for biasing the drain of transistor $T_1$. However, with this circuit considerable area is gained on the semiconductor material chip with respect to surge inductances or microstrip lines and it is a circuit which is especially suitable for integrated circuits since, in this case, the saturable load or loads $T_2$ are small areas with respect to the main transistor $T_1$. In fact, the saturable loads are calculated so as to be optimized and to supply just the current required for biasing transistor $T_1$ which has an area depending on the power which it is to convey. Adding one or more small saturable load or loads to an integrated circuit does not raise appreciable technological problems as would be the case with inductances or microstrip lines.

However, the circuit of FIG. 5 has a disadvantage: the biasing point of the main transistor $T_1$ is set once and for all by the width of transistor $T_2$, which must be less than or equal to that of $T_1$. This type of circuit then excludes the possibility of varying the gate bias voltage $V_G$, so the biasing point of the main transistor $T_1$. Now, it has been stated that in some amplifiers or phase shifters, for example, it is advantageous to be able to vary the biasing point of a transistor.

Figure 6:
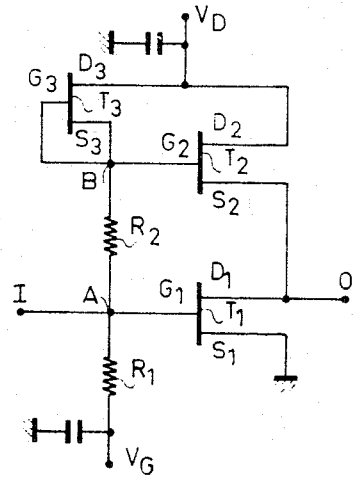
FIG. 6: a circuit for polarizing a field effect transistor in accordance with the invention (common source)

The biasing circuit of the invention is shown in FIG. 6. In this Figure, the main transistor $T_1$ which it is desired to suitably bias, has its gate biased by a voltage $V_G$ applied through a resistor $R_1$. This bias voltage is of course, as in the case of all the Figures, decoupled to ground through a capacitor;

Biasing of drain $D_1$ is provided from a bias voltage $V_D$ through at least one saturable load T 2, whose gate-source voltage $V_{G2S2}$ follows the gate-source voltage $V_{G1S1}$ of the main transistor $T_1$. This is obtained by a resistance bridge $R_1$ and $R_2$, $R_1$ being the bias resistance for the gate $G_1$ of transistor $T_1$, this resistance bridge $R_1$ and $R_2$ being itself fed by a small current source connected transistor $T_3$, whose gate and source are connected together, transistor $T_3$ itself being connected to the drain voltage source $V_D$. The gate of the main transistor $T_1$ is therefore connected to point A, which is the common point between the two resistors $R_1$ and $R_2$ of the resistance bridge, whereas the gate of the saturable load transistor $T_2$ is connected to point B, which happens to be the power supply point of the divider bridge by the small transistor $T_3$.

The circuit of the invention combines together then the following advantages:

the gate bias voltage $G_1$ for the main transistor $T_1$ is applied through a resistor $R_1$ whose technology is compatible with that of integrated circuits, the bias voltage for the drain $D_1$ is applied, from the voltage $V_D$, to a second saturable load connected transistor $T_2$, but the gate voltage $G_2$ of transistor $T_2$ follows the gate voltage G 1 of transistor $T_1$ because of a divider bridge connected between the two voltage sources $V_D$ and V G, having a small transistor $T_3$ operating as a current source, the gate $G_1$ being connected to point A of the divider bridge whereas the gate $G_2$ is connected to point B of this same divider bridge.

Let us take an example. If $V_D=6$ V, $V_G=-3$ V, $R_1=R_2=1000$ ohms and the saturation current of the small transistor $T_3$ is 3 mA, we then have $V_a=V_{G1}=0$ V and $V_B=V_{G2}=3$ V. If, furthermore, the widths of the main $T_1$ and secondary $T_2$ transistors are identical, $V_{D1}=3$ V. Thus, the gate-source voltages $V_{G1S1}$ and $V_{G2S2}$ are both equal to 0 V. If the gate bias voltage varies, for example $V_G=-5$ V, taking into account the fact that the saturation current of transistor $T_3$ does not change, the new gate-source voltages $V_{G1S1}$ and $V_{G2S2}$ are still identical but equal to $-2$ V.

In the case where the resistors $R_1$ and $R_2$ of the bridge are not quite equal to the scheduled value, but identical to each other, it is sufficient to vary the drain bias voltage $V_D$ so as to find again the equality of values $V_{G1S1}=V_{G2S2}$.

Similarly, if the saturation current of the secondary transistor $T_2$ is not quite equal to the scheduled value, varying the drain bias voltage $V_D$ still allows the equality $V_{G1S1}=V_{G2S2}$ to be obtained again.

In so far as the ultra high frequencies are concerned, which are fed into the transistor at point I and leave at point O, the ultra high frequency circuit external to transistor $T_1$ only "sees" the resistor $R_1$ in parallel at the input of transistor $T_1$. In fact, resistor $R_2$ is in series with the dynamic resistance of the small current source transistor $T_3$, whose resistance is very high.

Figure 7:
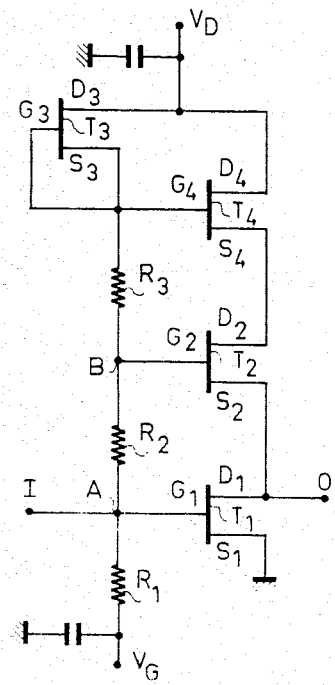
FIG. 7: a biasing circuit for a field effect transistor in accordance with the invention, in a first variant.

The current source transistor $T_3$ must be about 10 to 20 times narrower than the width of the main $T_1$ and secondary $T_2$ transistors. Consequently, the dimensions of the current source formed by $T_3$ is out of all proportion with the dimensions of inductances and microstrip lines which were analyzed in connection with FIGS. 2 and 3. If the current required for biasing transistor $T_1$ requires too small a transistor $T_3$, less than 5 microns, it is still possible to increase the length of its gate, for the working frequency of transistor $T_3$ is not of primary importance like the working frequency of the main transistor $T_1$. It was stated in connected with FIG. 5 that the main transistor $T_1$ is sometimes biased through a plurality of secondary transistors $T_2$ connected as saturable load. FIG. 7 shows one illustration of this case, within the field of the invention, that is to say that the main transistor $T_1$ is biased through two secondary transistors $T_2$ and $T_4$ connected as saturable load. In this case, the divider bridge comprises as many resistors, $R_1$, $R_2$ and $R_3$ as there are transistors, including the main transistor. Thus, if FIG. 7 comprised a third saturable load transistor, the divider bridge would comprise a fourth resistor.

Figure 8:
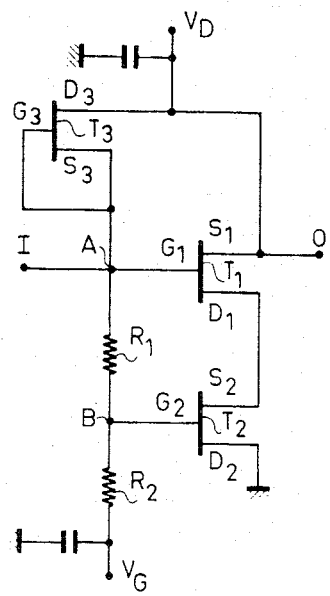
FIG. 8: a biasing circuit for a field effect transistor in accordance with the invention (common drain)

FIGS. 6 and 7 show the case of a main transistor $T_1$ operating with a common source. FIG. 8 shows the circuit of the invention when the main transistor $T_1$ operates with common drain. In this case, gate $G_1$ of the main transistor $T_1$ is always biased through a resistive device, but this device in the present case is separated into two resistors $R_1$ and $R_2$ which form the divider bridge biasing the gate $G_2$ of the secondary transistor $T_2$ operating as saturable load. Transistor $T_3$ operating as current source is supplied on the one hand by the drain bias voltage $V_D$ and is connected to the divider bridge $R_1$ and $R_2$. The gate-source voltage $V_{G2S2}$ of transistor $T_2$ follows the gate-source voltage $V_{G1S1}$ of the main transistor $T_1$ when the gate bias voltage $V_G$ varies.

With respect to FIG. 6, the difference in the case of FIG. 8 is that the bias resistor for the gate $G_1$ of transistor $R_1$ is no longer the resistor $R_1$ alone but is equal to the resistance $R_1+R_2$.

Furthermore, this circuit with common drain connection may be formed with a plurality of secondary transistors $T_2, T_4 \ldots$ etc, as has been shown in FIG. 7.

In the common drain connection shown in FIG. 8, the ultra high frequency circuit external to the main transistor $T_1$ "sees", at the input of the transistor, the resistance $R_1$ and $R_2$ in parallel with the dynamic resistance of the current source transistor $T_3$, which is very high since transistor $T_3$ is ten to twenty times narrower than the main $T_1$ and secondary $T_2$ transistors.

Figure 9:
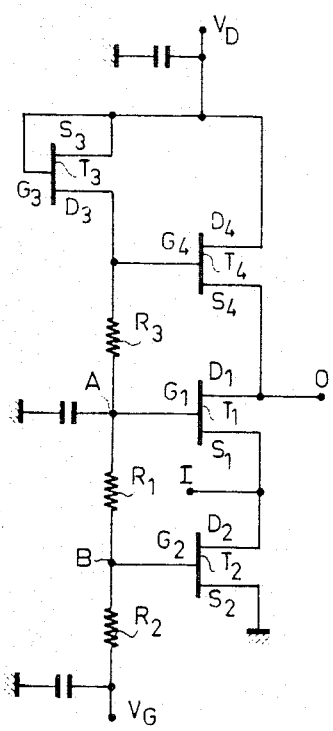
FIG. 9: a biasing circuit for a field effect transistor in accordance with the invention (common gate).

Finally, FIG. 9 shows the circuit diagram of the biasing circuit when the main transistor $T_1$ is connected with common gate. In this case, the ultra high frequency signals are fed into the circuits of the main transistor $T_1$ through point I onto its source $S_1$ and leave on the drain at point O. Gate $G_1$ is decoupled to ground through a capacity.

Gate $G_1$ of the main transistor $T_1$ is biased by a gate bias voltage $V_G$ applied through a resistive element formed by resistors $R_1$ and $R_2$. These latter form the divider bridge which biases gate $G_2$ of a secondary transistor $T_2$ biasing the source of a main transistor $T_1$. But in this case, the divider bridge also comprises a resistor $R_3$, connected in series with a small current source transistor $T_3$, resistor $R_3$ which is an integral part of the divider bridge biasing the gate $G_4$ of a second secondary transistor $T_4$ which biases the drain of the main transistor $T_1$.

With a circuit for biasing a field effect transistor of the invention, a field effect transistor can then be suitably biased whatever its type of connection common source, common drain or common gate. It uses a minimum of two transistors, the first operating as a saturable load biases a drain of the main transistor whereas the second, operating as current source, feeds a voltage divider bridge. The presence of two additional transistors is not a disadvantage from the point of view of integrated circuit integration for these secondary transistors do not occupy a greater area than the main transistor. Furthermore, with this circuit the biasing point of the main transistor may be varied so the circuits in which this transistor may be used may be optimized, such as ultra high frequency amplifiers or phase shifters.

What is claimed is:

1. In a circuit for biasing a first field effect transistor, operating in the ultra high frequency range, whose gate is biased by a voltage through a first resistor, at least one main electrode of the first transistor, through which the ultra high frequency signal leaves, is biased from a voltage source through a second field effect transistor operating as a saturable load, whose gate-source voltage follows the gate-source voltage of the first transistor, the gate of the first transistor and the gate of the second transistor being connected at two points of a divider bridge formed by at least two resistors including said first resistor, supplied from the voltage source and the bias voltage through a third transistor connected as current source, the gate of said third transistor also being connected to the divider bridge.

2. The bias circuit as claimed in claim 1, wherein said first transistor is connected as common source, the ultra high frequency signal being introduced on its gate and the drain forms an output terminal.

3. The bias circuit as claimed in claim 1, wherein said control electrode of the first transistor is polarized through a plurality of series connected second transistors whose gates are connected to as many resistors of said divider bridge.

4. The bias circuit as claimed in claim 1, wherein the biasing point of said first transistor is adjustable by varying the bias voltage of said control electrode.

5. The bias circuit as claimed in claim 1, wherein, said first transistor is mounted as a common drain, the bias voltage is applied to the source of said first transistor and the second transistor operating as a saturable load is connected between the drain of said first transistor and ground.

6. In a circuit for biasing a first field effect transistor, operating in the ultra high frequency range, whose gate is biased by a voltage through a first resistor, at least one main electrode of the first transistor through which the ultra high frequency signal leaves, is biased from a voltage source through a second field effect transistor operating as a saturable load, whose gate-source voltage follows the gate-source voltage of the first transistor, the gate of the first transistor and the gate of the second transistor being connected at two points of a divider bridge formed by at least two resistors including said first resistor, supplied from the voltage source and the bias voltage through a third transistor connected as a current source wherein said first transistor is connected as a common gate, the first main electrode of said first transistor is biased to ground through a fourth transistor, and a second main electrode of said first transistor is biased to said bias voltage source through the second transistor, the second and fourth transistors having their gates connected at two points on the divider bridge.

7. The bias circuit as claimed in any one of claims 1–6, constructed in the form of an integrated circuit.

* * * * *